United States Patent [19]

Noguchi et al.

[11] Patent Number: 5,681,643
[45] Date of Patent: Oct. 28, 1997

[54] ACTIVE ENERGY RAY-CURABLE COMPOSITION, RECORDING MEDIUM AND IMAGE-FORMING METHOD EMPLOYING THE SAME

[75] Inventors: Hiromichi Noguchi, Hachioji; Makiko Kimura, Sagamihara; Masato Katayama; Akio Kashiwazaki, both of Yokohama; Yoshie Nakata, Kawasaki; Yuko Nishioka, Tokyo, all of Japan

[73] Assignee: Canon Kabushiki Kaisha, Tokyo, Japan

[21] Appl. No.: 542,042

[22] Filed: Oct. 12, 1995

[30] Foreign Application Priority Data

Oct. 13, 1994 [JP] Japan .................................. 6-247675
Oct. 5, 1995 [JP] Japan .................................. 7-258814

[51] Int. Cl.⁶ ........................................................ B32B 3/00
[52] U.S. Cl. .................... 428/195; 428/411.1; 428/462; 428/500; 428/507; 428/532; 347/101
[58] Field of Search ........................... 428/411.1, 913, 428/914, 500, 524, 193, 462, 507, 532; 347/101

[56] References Cited

U.S. PATENT DOCUMENTS 4,839,399  6/1989  Sato et al. ................................ 522/14

(List continued on next page.)

FOREIGN PATENT DOCUMENTS 0213317  3/1987  European Pat. Off. ...... C08F 246/00
0580030  1/1994  European Pat. Off. ...... D21H 19/00
1-286886  11/1989  Japan .......................... B41M 5/00

OTHER PUBLICATIONS

Chemical Abstracts, vol. III, No. 8, Aug. 21, 1989, Hashiguchi Yoshiharu, "Manufacture of highly water-absorbent resins", abstract, & JP-A-01 014 218 (Harima Chemicals), Jan. 18, 1989.

*Primary Examiner*—William Krynski
*Attorney, Agent, or Firm*—Fitzpatrick, Cella, Harper & Scinto

[57] ABSTRACT

Provided is a composition curable by active energy rays, comprising a cationic polyacryloyl compound having two or more acryloyl groups and one or more cation groups in a molecule, represented by any of General Formulae (1) to (6)

$$R_1-K_1-Z_1-K_1-R_1, \quad (1)$$

$$\begin{array}{c} R_1 \\ | \\ K_1 \\ | \\ R_1-K_1-Z_2-K_1-R_1, \end{array} \quad (2)$$

$$\begin{array}{c} R_1 \\ | \\ K_1 \\ | \\ R_1-K_1-Z_3-K_1-R_1, \\ | \\ K_1 \\ | \\ R_1 \end{array} \quad (3)$$

$$\begin{array}{c} K_2 \\ | \\ R_2-Z_4-R_2, \\ | \\ K_2 \end{array} \quad (4)$$

$$\begin{array}{c} R_2-Z_5-R_2, \\ | \\ K_2 \end{array} \quad (5)$$

and $$\begin{array}{c} R_2 \\ | \\ R_2-Z_6-R_2 \\ | \\ K_2 \end{array} \quad (6)$$

wherein
$Z_1$ to $Z_6$ represent independently a residue derived from a polyhydric alcohol or a polyepoxide,
$K_1$ represents independently a radical of the formula $$\begin{array}{c} CH_3 \\ | \\ -CH_2-N^+-CH_2- \\ | \\ CH_3 \end{array} \quad \text{or} \quad \begin{array}{c} CH_3 \\ | \\ -CH_2-N^+- \\ | \\ CH_3 \end{array}$$

$K_2$ represents a radical of the formula $$\begin{array}{c} CH_3 \\ | \\ -N^+-CH_3 \\ | \\ CH_3 \end{array}$$

$R_1$ presents independently a radical of the formula $$\begin{array}{c} R_3 \\ | \\ CH_2=CCOOCH_2-, \end{array}$$

$$\begin{array}{c} R_3 \\ | \\ CH_2=CCOOCH_2CH_2-, \end{array}$$

$$\begin{array}{c} R_3 \\ | \\ CH_2=CCONHCH_2-, \end{array}$$

$$\begin{array}{c} R_3 \\ | \\ CH_2=CCONHCH_2CH_2-, \end{array}$$

$$\begin{array}{c} R_3 \\ | \\ CH_2=CCONHCH_2CH(OH)-, \end{array}$$

or $$\begin{array}{c} R_3 \\ | \\ CH_2=C-CO- \end{array}$$

wherein
$R_3$ is independently H— or $CH_3$—, and
$R_2$ represents independently a radical of the formula $$CH_2=CHCOO-, \text{ or } CH_2=C(CH_3)COO-.$$

18 Claims, No Drawings

U.S. PATENT DOCUMENTS

| | | | |
|---|---|---|---|
| 4,839,400 | 6/1989 | Sato et al. | 522/14 |
| 5,068,257 | 11/1991 | Noguchi | 522/31 |
| 5,068,258 | 11/1991 | Noguchi | 522/31 |
| 5,068,259 | 11/1991 | Noguchi | 522/31 |
| 5,068,260 | 11/1991 | Noguchi | 522/31 |
| 5,068,262 | 11/1991 | Noguchi | 522/95 |
| 5,068,263 | 11/1991 | Noguchi | 522/109 |
| 5,334,999 | 8/1994 | Kashiwazski et al. | 347/65 |

ACTIVE ENERGY RAY-CURABLE COMPOSITION, RECORDING MEDIUM AND IMAGE-FORMING METHOD EMPLOYING THE SAME

BACKGROUND OF THE INVENTION

1. Field of the Invention

The present invention relates to a novel composition which is curable by active energy rays, and a recording medium using the same. In particular, the present invention relates to a composition suitable for formation of an ink-receiving layer, exhibiting a high absorbency for water-based ink and a high durability, a recording medium formed using the ink-receiving layer, and an image-forming method employing the recording medium.

2. Related Background Art

Ink-jet recording systems have made rapid progress in recent years among digital recording systems, and have come to be used widely as the output system for personal computers in offices. The wide use of the ink-jet recording systems results from development of small but high-density multi-nozzle ink-jet recording heads, development of precise driving technique therefor, and development of recording media for high printed-image quality. Most of the practical ink-jet printing systems use inks mainly composed of water. Water-based ink is desirable in office and industrial use in view of protection of the environment and safety to human health.

Problems are still involved in conventional recording media, such as ink-jet recording paper sheets and OHP films, suitable for printers employing a water-based ink. Firstly, ink-jet recording paper sheets possess inadequate water fastness characteristics tending to permit bleeding by diffusion of a dye in the water-based ink on the paper sheet under high humidity conditions. Secondly, OHP films themselves possess inadequate water fastness characteristics and do not impart a water fastness to an image. Special care should be taken for use and storage of OHP films.

The above problems are caused by incorporation of a water-soluble polymer, for imparting high absorbency for water-based ink into the recording medium. Both in ink-jet recording paper sheets and in OHP films, good water-fastness characteristics of the recording medium with a water-based ink has been considered to be incompatible with the ink-receiving property and the ink absorbency.

On the other hand, the ink-jet printer is intended to be used industrially as a digital printing apparatus. In such industrial applications, the recording media often have no absorbency for water-based inks. For such recording media, it is necessary to form an ink-receiving layer preliminarily on a recording medium to use a water-based ink. In industrial uses, various recording media are employed including metal plates, plastics, rubbers, ceramics, cloths, leathers, glass, and food wrapping materials. The specific examples are prepaid cards, compact disks, laser disks, nameplates, image displays, image formation on an FRP plate and on porcelain plate, textile printing, dyeing of leather, formation of stained glass, reproduction of pictures and paintings, and so forth. Most of the base materials for the uses above have obviously no absorbency for water-based inks.

Simple application of a conventional coating material on coated paper sheets and OHP films for ink-jet printing, however, is not practical for preparation of the above-mentioned industrial printing media. The coating materials generally used possess inadequate adhesiveness and coating suitability to various base materials, durability and water fastness of the coating films, water fastness of the formed image, resistance to scratching, and so forth.

In the above industrial applications, the coating material for ink-receiving layer is required, in addition to a sufficient coloring ability, to have the properties such as (1) rapid formation of an ink-receiving layer, (2) high adhesiveness of the formed layer to the base material, (3) rapid fixation of ink, (4) high affinity with coloring matter (dye or pigment) in the ink, (5) formation of sharp images with high resolution, (6) high durability of the resin layer, and so forth.

Conventional materials for ink-receiving layer of ink-jet recording demonstrate poor performance in industrial uses, and cannot be used therefor.

In order to satisfy the above required properties (1) to (6), techniques have been disclosed in which an ink-receiving layer for ink-jet recording is formed by ultraviolet curing (e.g., Japanese Patent Application Laid-Open No. 1-286886). However, the ink-receiving layers formed from a photopolymerizable monomer of a conventional water-soluble acrylic ester type do not satisfy the requirements mentioned above, in particular a high ink absorbency, a high ink absorption rate, and a complete affinity to coloring matters, and therefore are not suitable for ink-jet color printers developed in recent years.

SUMMARY OF THE INVENTION

The present invention provides a composition which is curable by active energy rays for formation of an ink-receiving layer having the above properties (1) to (6), particularly exhibiting a high absorbency for a water-based ink and a high affinity to a coloring matter.

The present invention further intends to provide a recording medium having an ink-receiving layer formed from the above composition, and a method of producing the recording medium.

The present invention still further intends to provide a method of image formation with high durability of the formed image.

The above objects can be achieved by the present invention.

According to the present invention there is provided a composition curable by active energy rays of the present invention comprising a cationic polyacryloyl compound having two or more acryloyl groups and one or more cationic groups in a molecule, represented by any of general formulae (1) to (6)

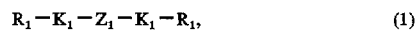
(1)

(2)

(3)

(4)

-continued

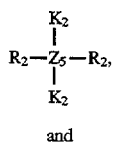
and
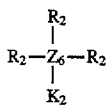

wherein $Z_1$ to $Z_6$ represent independently a residue derived from a polyhydric alcohol or a polyepoxide, $K_1$ represents independently a radical of the formula

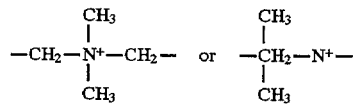

each of $K_2$ represents a radical of the formula $$-\overset{\underset{|}{CH_3}}{\underset{|}{N^+}}-CH_3$$
$$CH_3$$

$R_1$ represents independently:

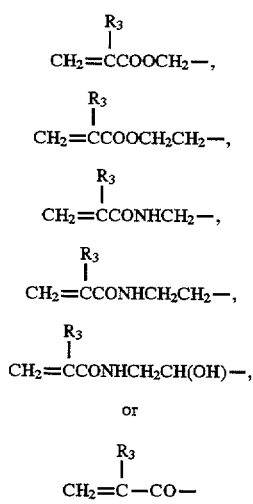

wherein $R_3$ is independently H— or $CH_3$—, and $R_2$ represents independently a radical of the formula $CH_2=CHCOO-$, or $CH_2=C(CH_3)COO-$.

According to the present invention there is further provided a recording medium comprising a base material and an ink-receiving layer formed thereon, in which the ink-receiving layer comprises a polymer of a cationic polyacryloyl compound having two or more acryloyl groups and one or more cationic groups in a molecule, represented by any of general formulae (1) to (6) above.

According to the present invention there is further provided a process for producing a recording medium, comprising applying, on a base material, a composition curable by active energy rays comprising a cationic polyacryloyl compound having two or more acryloyl groups and one or more cationic groups in a molecule, represented by any of general formulae (1) to (6) above, and irradiating the composition with active energy rays.

DESCRIPTION OF THE PREFERRED EMBODIMENTS

The inventors of the present invention have studied the materials commonly used to form a recording layer to be used for ink-jet recording with a water-based ink, particularly materials suitable for ink-jet color printers being widely used in recent years, and satisfy the above requirements (1) to (6), in particular exhibiting a high absorbency for a water-based ink with a high absorption rate and a high affinity to a coloring matter. As the results, the inventors have found that the cationic acryloyl compounds represented by the above General Formulae (1) to (6) exhibit satisfactory effects and satisfy many of the required properties.

The present invention relates to a material curable by active energy rays, in particular, by ultraviolet rays. The two or more acryloyl groups in the compounds of General Formulae (1) to (6) exhibit a curing function by an action of ultraviolet rays, and the one or more cationic groups of these compounds serve as the fixing site for a dye or a pigment dispersion. The synergetic functions of these materials result in the formation of an ink-receiving layer, which 1) rapidly solidifies by irradiation with active energy rays, such as ultraviolet rays, and with electron rays, after application onto a base material, and 2) demonstrates excellent dye fixation.

The present invention is described below in more detail.

The basic component constituting the composition of the present invention is a cationic polyacryloyl compound represented by any of the above General Formulae (1) to (6), having two or more acryloyl groups and one or more cationic groups in the molecule. The compound can be prepared, for example, by any of the synthesis routes below.

Synthesis Route 1

A polyepoxide having two or more epoxy groups is reacted with an acrylic monomer having a tertiary amino group:

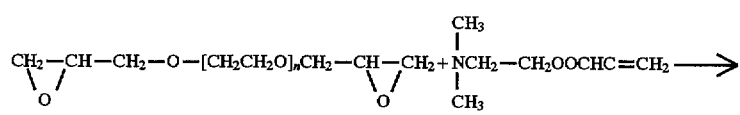

-continued

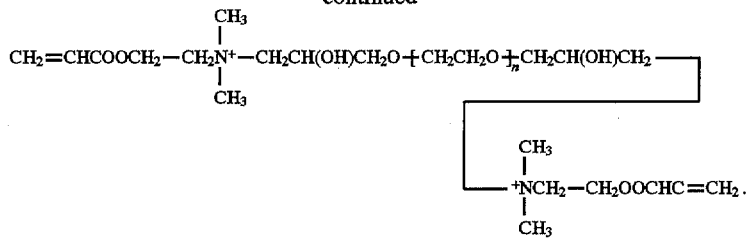

Synthesis Route 2

At least one of n epoxy groups (n≧b 3) of a polyepoxide is reacted with a trialkylamine such as trimethylamine to introduce a cationic group cationize it (cationization), and then the remaining m epoxy groups (m≧2) are allowed to react with (meth)acrylic acid:

Synthesis Route 4

At least one hydroxyl group of a polyacryloyl compound having one or more hydroxyl groups is reacted with a cationizing agent (cation-introducing agent):

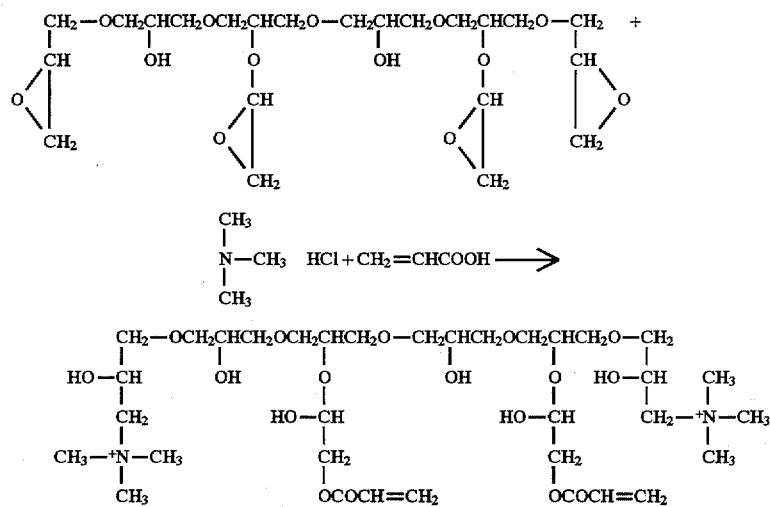

Synthesis Route 3

At least one of k acryloyl groups (k≧3) of a photopolymerizable polyacryloyl compound is reacted with trimethylamine or the like by Michael addition reaction to cationize it and to form a compound having h acryloyl groups (h≧2) and (k-h) cationic groups:

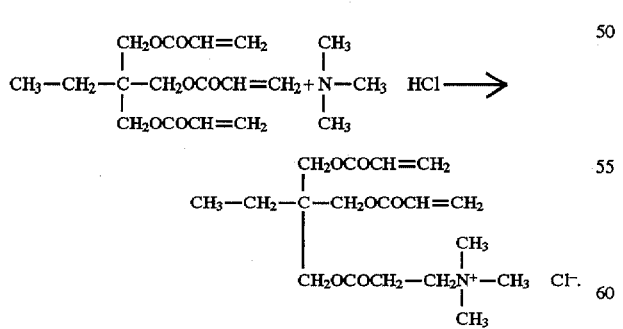

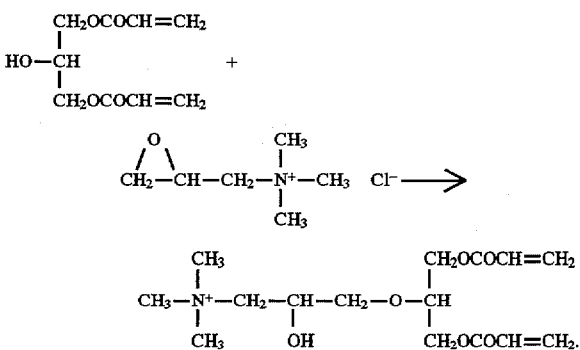

A suitable synthesis route may be selected in consideration of the structure and purity of the starting material and the structure of the intended compound.

Examples of the polyepoxides used in Synthesis Routes 1 and 2 are shown below:

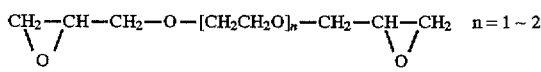
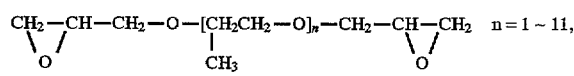
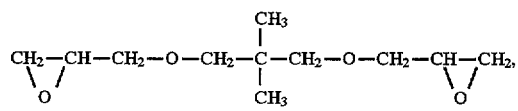
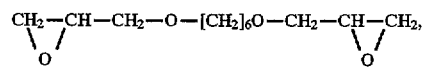
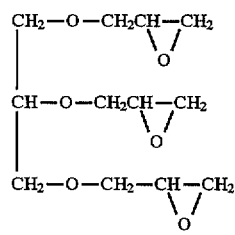
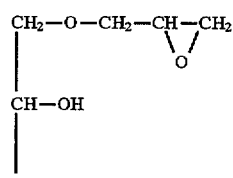
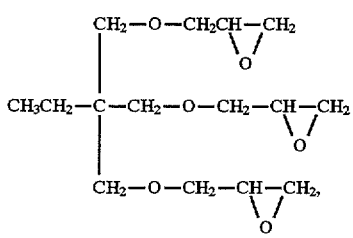
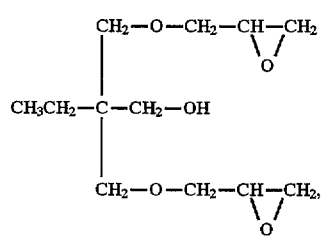
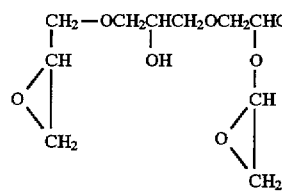
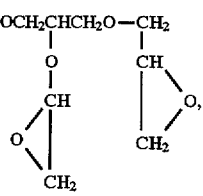
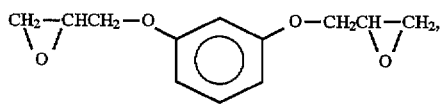
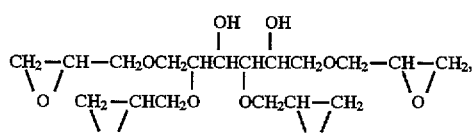
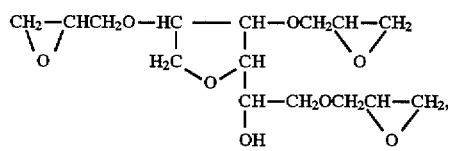
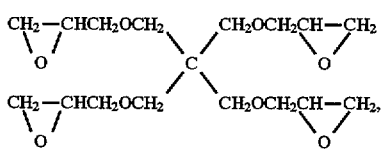
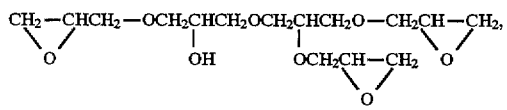
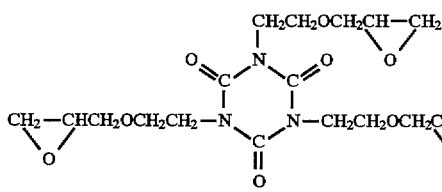
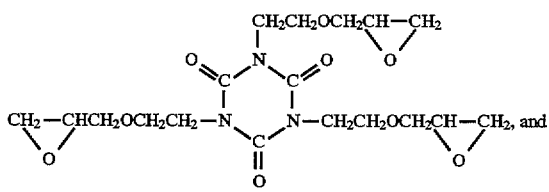
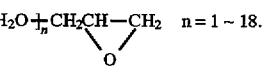
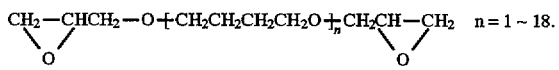

The compounds of General Formulae (1) to (6) can be synthesized in principle also from many polyglycidyl compounds other than the ones shown above having more glycidyl groups. Commercially available polyfunctional epoxides are exemplified by DENAKOL EX-810, DENAKOL EX-811, DENAKOL EX-851, DENAKOL EX-830, DENAKOL EX-832, DENAKOL EX-841, DENAKOL EX-861, DENAKOL EX-911, DENAKOL EX-941, DENAKOL EX-920, DENAKOL EX-921, DENAKOL EX-931, DENAKOL EX-211, DENAKOL EX-212, DENAKOL EX-221, DENAKOL EX-721, DENAKOL EX-313, and DENAKOL EX-321 (trade names, produced by Nagase Kasei Kogyo K.K.).

Examples of acrylic monomer having a tertiary amino group used in Synthesis Route 1 are shown below:

N,N-dimethylaminoethyl methacrylate ($CH_2$=C($CH_3$)—COO—$CH_2CH_2N(CH_3)_2$),

N,N-dimethylaminoethyl acrylate (CH₂=CH—COO—CH₂CH₂N(CH₃)₂),

N,N-dimethylaminopropyl methacrylate (CH₂=C(CH₃)—COO—CH₂CH₂CH₂N(CH₃)₂),

N,N-dimethylaminopropyl acrylate (CH₂=CH—COO—CH₂CH₂CH₂N(CH₃)₂),

N,N-dimethylacrylamide (CH₂=CH—CON(CH₃)₂),

N,N-dimethylmethacrylamide (CH₂=C(CH₃)—CON(CH₃)₂),

N,N-dimethylaminoethylacrylamide (CH₂=CH—CONHCH₂CH₂N(CH₃)₂),

N,N-dimethylaminoethylmethacrylamide (CH₂=C(CH₃)—CONHCH₂CH₂N(CH₃)₂),

N,N-dimethylaminopropylacrylamide (CH₂=CH—CONHCH₂CH₂CH₂N(CH₃)₂),

N,N-dimethylaminopropylmethacrylamide (CH₂=C(CH₃)—CONHCH₂CH₂CH₂N(CH₃)₂),

3-N,N-dimethylamino-2-hydroxypropylacrylamide (CH₂=CH—CONHCH₂CH(OH)CH₂N(CH₃)₂),

3-N,N-dimethylamino-2-hydroxypropylmethacrylamide (CH₂C(CH₃)—CONHCH₂CH(OH)CH₂N(CH₃)₂).

The compounds having three or more acryloyl groups in the molecule used in Synthesis Route 3 include (meth)acrylate esters of polyols having three or more hydroxyl groups such as trimethylolpropane triacrylate; (meth)acrylate esters of polyepoxides having three or more epoxide groups. The aforementioned polyols having three or more hydroxyl groups includes glycerin, trimethylolpropane, pentaerythritol, dipentaerythritol, polyglycerin, 1,2,6-hexanetriol, 1,3,5-pentanetriol, 1,2,5-pentanetriol, 1,2,4-butanetriol, tri(hydroxyethyl) isocyanurate, sugar alcohols and the like.

The polyacryloyl compounds having one or more hydroxyl group used in Synthesis Route 4 are partial (meth)acrylate esters of the above polyols, and (meth)acrylate esters of the above polyglycidyl ethers (epoxyacrylates of photopolymerizable oligomer as commercial products). The cationizing agent used in Synthesis Route 4 includes compounds having both a glycidyl group and a cationic group such as Wisetecks E-100, Wisetecks N-50 and the like (trade names, produced by Nagase Kasei K.K.).

Further, the compound of General Formulae (1) to (6) can be synthesized through a route in which a compound having two or more halomethyl groups at the terminals of the molecule is reacted with a tertiary amine monomer. However, since few kinds of the compounds having two or more halomethyl groups at the terminals of the molecule are available commercially, the aforementioned water-soluble polyepoxides are conveniently used.

Examples of the compounds synthesized by above Synthesis Routes 1 to 4 and useful in the present invention are shown below.

(For Synthesis Route 1)

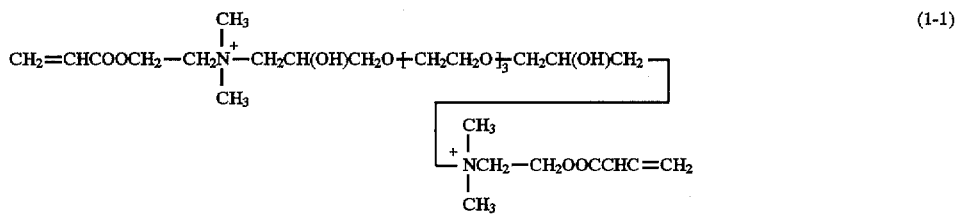

(1-1)

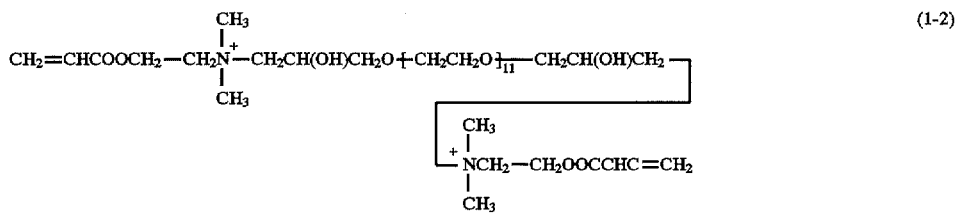

(1-2)

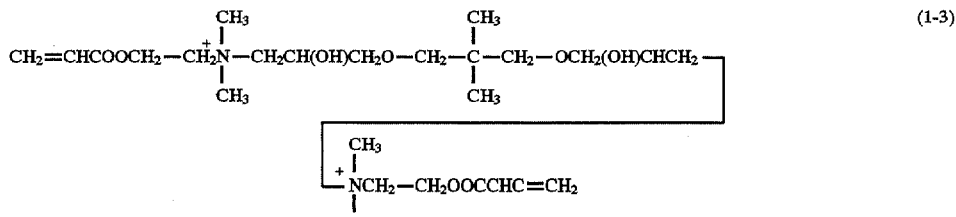

(1-3)

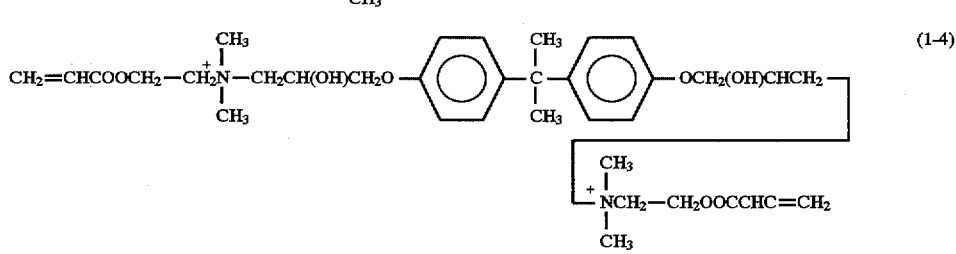

(1-4)

-continued
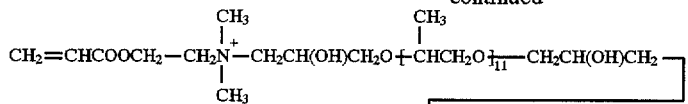 (1-5)
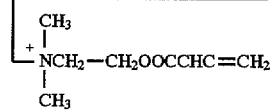
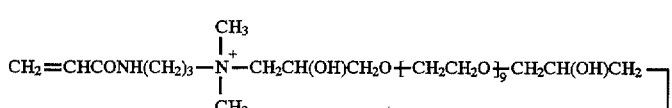 (1-6)
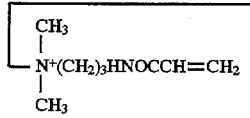
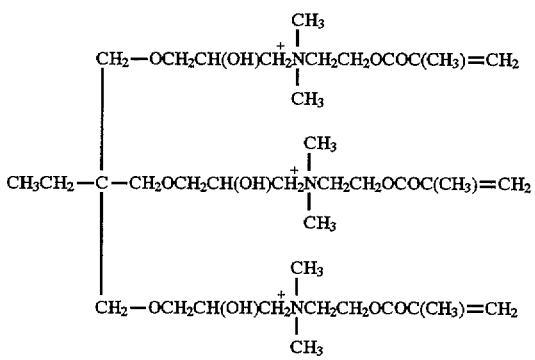 (1-7)
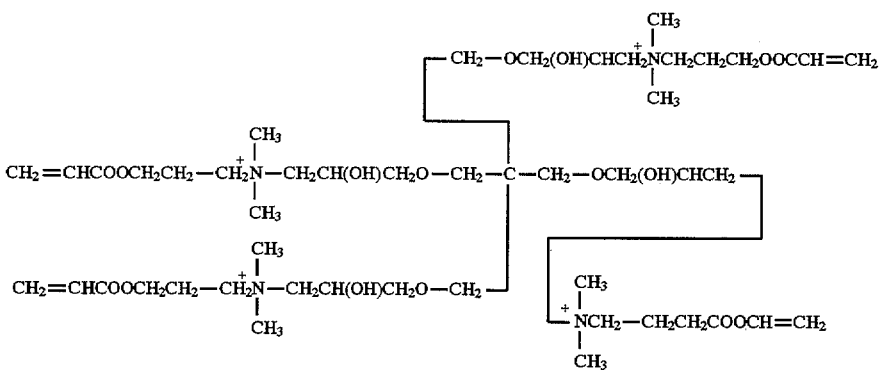 (1-8)
(For Synthesis Route 2)
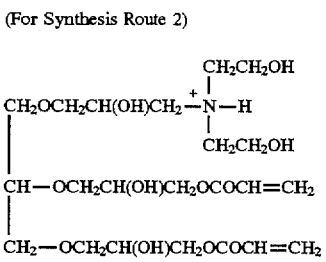 (2-1)
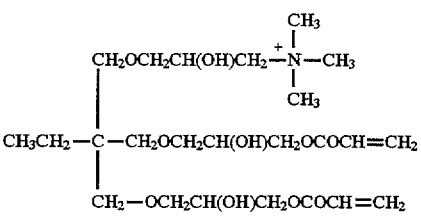 (2-2)

-continued
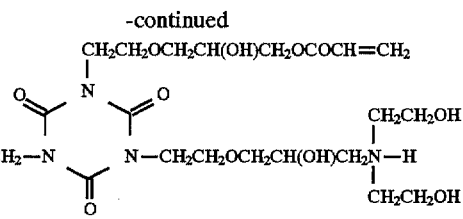 (2-3)
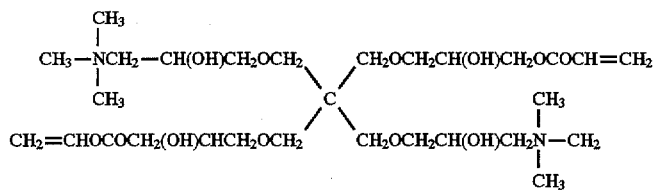 (2-4)
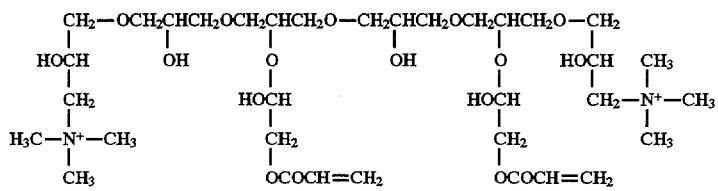 (2-5)
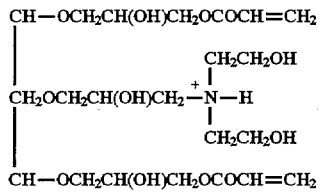 (2-6)
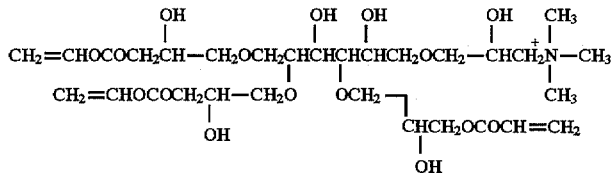 (2-7)
(For Synthesis Route 3)
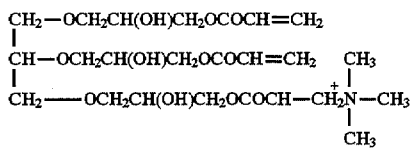 (3-1)
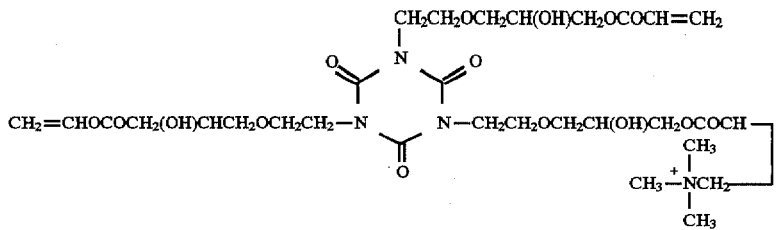 (3-2)
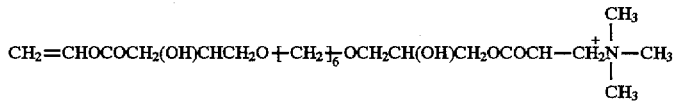 (3-3)

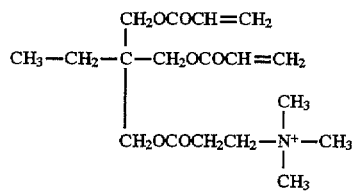
(3-4)

(For Synthesis Route 4)

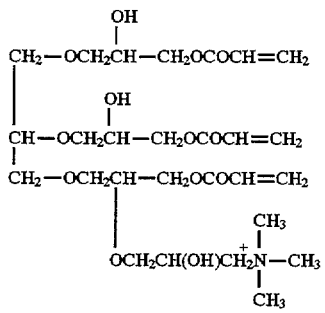
(4-1)

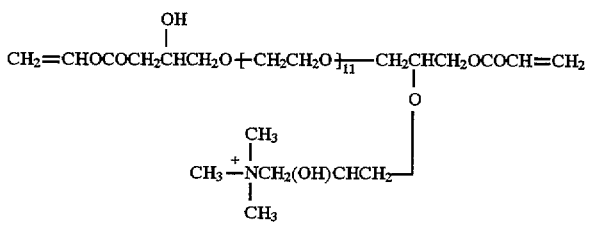
(4-2)

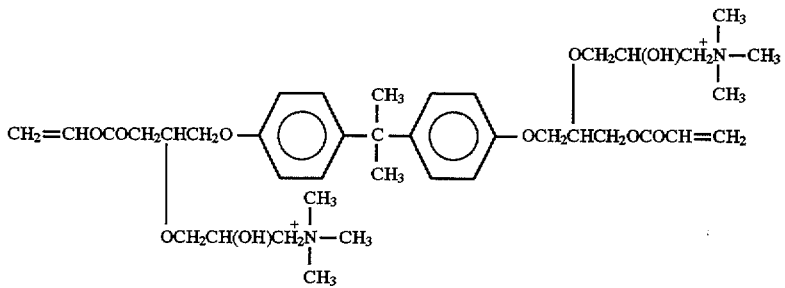
(4-3)

Typical chemical formulae of preferable compounds are shown there in the present invention among the aforementioned six general formulae and the aforementioned four synthesis routes, in view of the functional properties and ease of production. Here, the term "typical chemical formula" means a chemical formula of the main product, which is presumed from a given structure of a starting material because industrial products used as starting materials such as epoxy resins may inevitably contain some amount of by-products such as isomers, and reaction products of excess epichlorohydrin, partially saponified epoxy resins and the like contained in the epoxy resins. These compounds include wide varieties of structures, and therefrom the most suitable structure and the suitable synthesis route can be selected.

The compound represented by any of General Formulae (1) to (6), which is the basic material for constituting the composition of the present invention, is contained in the composition as a material for forming an ink-receiving layer. The content of the compound in the ink-receiving layer is not specially limited, provided that functions such as a ultraviolet curability, a dye fixability of the ink-receiving layer and the like can be exhibited originated from the compound. The optimum component ratio in the composition can be selected depending on the intended performance and the employed film forming method.

However, in order to achieve sufficient functions, the compound of General Formulae (1) to (6) is contained in the composition at a content not less than 25% by weight, more preferably not less than 50% by weight, still more preferably from 55% to 98% by weight.

[Polymerization Initiator]

The composition of the present invention may further contain an initiator which is activatable by active energy rays. When such a polymerization initiator is mixed with a cationic polyacryloyl compound of any of General Formulae (1) to (6), a solid polymer layer, namely an ink-receiving layer, can be formed in a short time by exposure to ultraviolet light or other active energy rays.

The polymerization initiator includes:

1-hydroxycyclohexyl phenyl ketone, 2-hydroxy-2-methyl-1-phenylpropan-1-one, 1-(4-isopropylphenyl)-2-hydroxy-2-methylpropan-1-one; acetophenones such as 2,2-diethoxyacetophenone, 2,2-dimethoxy-2-phenylacetophenone, 2-hydroxy-2-methyl-1-phenylpropan-1-one, 2-methyl-1-[4-(methylthio)phenyl]-2-morpholinopropane-1,4-phenoxydichloroacetophenone, 4-(2-hydroxyethoxy)phenyl (2-hydroxy-2-propyl) ketone, p-t-butyldichloroacetophenone, p-t- butyltrichloroacetophenone, and p-dimethylaminoacetophenone; benzoin ethers such as benzoin methyl ether, benzoin ethyl ether, benzoin isopropyl ether, benzoin n-butyl ether, benzoin isobutyl ether, and benzyl dimethyl ketal; benzophenones such as benzophenone, benzophenone methyl ether, benzoyl benzoic acid, methyl benzoylbenzoate, hydroxybenzophenone, 4-phenylbenzophenone, 3,3'-dimethyl-4-methoxybenzophenone, 3,3,'-bis(N,N-dimethylamino)benzophenone, 4,4,'-bis(N,N-diethylamino)benzophenone, 4',4"-diethylisophthalophene, 3,3',4,4'-tetra(t-butyloxycarbonyl)benzophenone, 4-benzoyl-4'-methyldiphenyl sulfide, and acrylated benzophenone; xanthones such as thioxanthone, 2-methylthioxanthone, isopropylthioxanthone, 2,4-dimethylthioxanthone, 2,4-diethylthioxanthone, 2,4-isopropylthioxanthone, 2-chlorothioxanthone, and 2,4-dichlorothioxanthone; diketones such as diacetyl, and benzil; quinones such as 2-ethylanthraquinone, 2-t-butylanthraquinone, 2,3-diphenylanthraquinone, 1,2-benzanthraquinone, octamethylanthraquinone, camphoroquinone, dibenzosuberone, and 9,10-phenanthrene quinone. Further, CGI 1700, and CGI 149 (trade names, blends based on bisacylphosphinoxide, produced by Japan Ciba Geigy Co.) which are visible light-sensitive and are suitable as an initiator in white pigment system, are useful for dispersion system.

The polymerization initiator is employed preferably in an amount ranging from about 1 to about 10 parts by weight based on 100 parts by weight of the compound of General Formulae (1) to (6). When a compound other than the one of General Formulae (1) to (6) is used in combination, the polymerization initiator is preferably used in an amount of 1 to 10 parts by weight based on the entire solid matter.

[Acrylic Photopolymerizable Compound]

The composition for an ink-receiving layer of the present invention may further contain a photopolymerizable compound having two or more acryloyl groups but having no cationic group in a molecule, namely a known acrylic photopolymerizable compound. Such a known acrylic photopolymerizable compound has no dye fixation property, due to having no cationic group, but is useful for adjusting a hydrophilicity-hydrophobicity balance of the solid layer (ink-receiving layer) itself, improvement of adhesiveness of the layer to the base material, adjustment of film properties such as hardness and flexibility of the solid layer. When the ink-receiving layer is formed by use only of a cationic polymerizable monomer having a non-cationic group, the layer becomes excessively hydrophilic, tending to cause curling of the base material. The use of an acrylic type photopolymerizable compound having no cationic group in combination is effective for adjusting such properties.

The acrylic photopolymerizable compound having no cationic group includes (meth)acrylic esters of polyhydric alcohols, glycols, polyethylene glycols, polyesterpolyols, polyetherpolyols, and urethane-modified polyethers or polyesters; and (meth)acrylate esters of epoxy resins.

Specific examples thereof include: ethylene glycol di(meth)acrylate, propanediol di(meth)acrylate, butanediol di(meth)acrylate, pentanediol di(meth)acrylate, hexanediol di(meth)acrylate, neopentylglycol di(meth)acrylate, neopentylglycol hydroxypivalate di(meth)acrylate, polyethylene glycol di(meth)acrylate, polypropylene glycol di(meth) acrylate, polytetrafuran glycol di(meth)acrylate, trimethylolpropane tri(meth)acrylate, pentaerythritol tri(meth) acrylate, and pentaerythritol tetra(meth)acrylate; (meth) acrylate esters of polyesters or polyurethanes such as Arronix M-1100, Arronix M-1200, Arronix M-6100, Arronix M-6200, Arronix M-6250, Arronix M-6300, Arronix M-6400, Arronix M-7100, Arronix M-8030, Arronix M-8100 (Arronix: trade name, produced by Toagosei Chemical Industry Co.), Kayarad DPCA-120, Kayarad DPCA-20, Kayarad DPCA-30, Kayarad DPCA-60, Kayarad R-526, Kayarad R-629, and Kayarad R-644 (Kayarad: trade name, produced by Nippon Kayaku Co., Ltd.).

Specific examples of the above photopolymerizable compound having no cationic group, derived from epoxy resins include: (meth)acrylate esters of compounds having two or more epoxy groups in the molecule such as 1,6-hexanediol diglycidyl ether di(meth)acrylate, trimethylolpropane triglycidyl ether tri(meth)acrylate, glycerin triglycidyl ether tri(meth)acrylate, isocyanuric acid triglycidyl ether tri(meth) acrylate, (meth)acrylic esters of novolak type epoxy resins, and (meth)acrylic esters of a bisphenol type epoxy resin: DENAKOL Acrylates DM-201, DM-811, DM-851, DM-832, DA-911, DA-920, DA-931, DA-314, DA-701, and DA-722 (DENAKOLs: trade names, produced by Nagase Kasei Kogyo K.K.).

The acrylic photopolymerizable compound having no cationic group is used in an amount preferably of 10 to 200 parts by weight for 100 parts by weight of a compound of any of General Formulae (1) to (6).

In addition to the above polyfunctional monomer, a monofunctional monomer having a tertiary amino group or a quaternary ammonium group may be incorporated into the composition for the purpose of decreasing a viscosity. The monomer includes the quaternary compounds of a monofunctional acrylic monomer having a tertiary amino group used in Synthesis Route 1 for cation introduction.

[Water-soluble Polymer]

The composition of the present invention may further contain a water-soluble monomer for adjusting the ink absorption capacity and the ink absorption rate of the ink-receiving layer. The water-soluble polymer specifically includes commercially available water-soluble or water-swelling polymers such as polyvinyl alcohol, partially saponified polyvinyl acetate, polyvinylformal, polyvinylbutyral, gelatin, oarboxymethylcellulose, hydroxyethylcellulose, hydroxypropylcellulose, hydroxyethylstarch, polyethyloxazoline, polyethylene oxide, polyethylene. glycol, polypropylene oxide, and ethylene oxide/propylene oxide block copolymer.

Of these, particularly preferred are polyvinyl alcohol, cationized polyvinyl alcohol, cationized starch, water-soluble resins having a cationic monomer unit at a ratio of 15 mol % or more, polyacrylamides, poly-N-vinylpyrrolidone, polyethylene oxide, and polyethylene oxide/propylene oxide block copolymers.

The water-soluble polymer is preferably contained in an amount of from 5% to 50% by weight of the composition.

Examples of the solvent used for the active energy ray curable composition of the present invention are water, water-miscible polar solvents such as ethyleneglycol monomethyl ether, ethyleneglycol monoethyl ether, isopropyl alcohol, N-methyl-2-pyrrolidone, methyl ethyl ketone, acetone, tetrahydrofuran, acetonitrile and the like, and mixtures thereof. Examples of mixed solvents are a mixture of water and isopropyl alcohol (50:50 by weight), a mixture of ethyleneglycol monomethyl ether and isopropyl alcohol (50:50 by weight), a mixture of ethyleneglycol monoethyl ether and methyl ethyl ketone (60:40 by weight), a mixture of N-methyl-2-pyrrolidone and water (70:30 by weight), a mixture of water and acetonitrile (50:50 by weight), and the like.

[Fine Particulate Material]

In production of an ink-jet recording paper sheet by using the composition of the present invention, a conventional fine particulate material or white pigment having a high void ratio may be dispersed into the composition for the purpose of improving an ink absorbency (absorption rate and capacity) or imparting a whiteness. The fine particulate material includes particles of inorganic material such as silica, magnesium carbonate, alumina, talc, clay, and titanium oxide; particles of organic material such as acrylic resins, styrene resins, silicone resins, vinyl resins, fluororesins, and urea resins. The fine particulate material is contained preferably at a content of 3% to 30% by weight of the composition.

[Process for Producing Recording Medium]

The recording medium of the present invention is prepared by applying the composition of the present invention on a base material, e.g., non-absorbent base material and curing it, prior to ink-jet printing. The application of the composition onto the base material may be conducted by any conventional application means such as a spinner, a roll coater, a spray coater, and a screen printer. After the application, the coating layer is dried by evaporation of the solvent, if necessary, and is solidified by polymerization by irradiation with active energy rays such as electron rays and ultraviolet rays.

The composition of the present invention is applicable not only to paper sheets and plastic films but also to non-absorbent base materials such as metal plates, plates and molded articles of plastics, rubbers, ceramics, cloths, leathers, glass plates, and food wrapping materials for imparting ink-receiving properties thereto. The method of application of the composition includes roll coating, screen printing, gravure printing, offset printing, spin coating, spray coating, dip coating, and bar coating; and transfer of a separately prepared film. In principle, an ink-jet method is also practicable for applying the composition diluted with a solvent to a viscosity of 5 cP or less onto the base material. In the case where the above coating application of the composition is not practicable without a solvent, the composition may be diluted with water, an alcohol, an acetate ester, a ketone or the like as the solvent.

[Supporting Film for OHP]

The composition of the present invention is useful for the preparation of an overhead projector sheet (OHP film) since the composition is transparent and has excellent ink absorbency and ink fixability characteristics. The supporting material for the OHP sheet is preferably a film used in graphic art, such as polyethylene terephthalate, cellulose acetate, polycarbonate, polyvinyl chloride, polystyrene, polysulfone, and aliphatic polyester film.

The present invention is described below in more detail by reference to Examples. In the description below, the unit "part" is based on weight unless otherwise mentioned.

SYNTHESIS EXAMPLE

The exemplified compound (1-6) of the formula

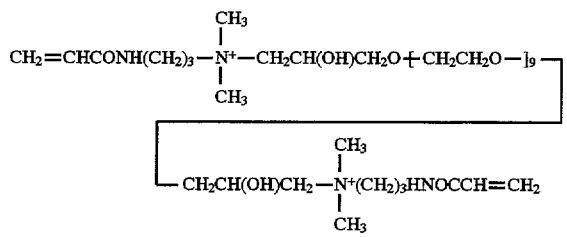

which belongs to the compounds of General Formula (1) was synthesized according to the aforementioned Synthesis Route 1.

To 140 g of polyethylene glycol diglycidyl ether (epoxy equivalent: 280, added ethylene oxide units: about 9 moles, DENAKOL EX-832, trade name, produced by Nagase Kasei Kogyo K.K.; molecular weight for n=9: 526) of the typical structure

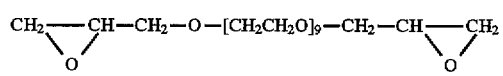

there were added 10 g of ethyl alcohol and 50 ml of water as catalyzers. Thereto, 75 g (about 0.5 mol) of N,N-dimethyl-2-hydroxypropylacrylamide was added, and the mixture was stirred uniformly in a pressure reactor. Then the mixture was heated at about 75° C. for 20 hours with stirring in the tightly closed reactor. After completing the reaction, water and unreacted N,N-dimethyl-2-hydroxypropylacrylamide were removed under a reduced pressure to obtain the product (1-6) as a viscous liquid (water content: 15%).

The average double bond equivalent of the resulting product was calculated from the weight of the reacted bromine, and the cation equivalent was measured by means of a colloid titration with potassium polyvinylsulfonate. The results are shown below. In the descriptions below, the term "double bond equivalent" means the molecular weight per one double bond, and the term "cation equivalent" means the molecular weight per one cationic group.

TABLE 1

|  | Double bound equivalent | Cation equivalent |
|---|---|---|
| Calculated | 425 | 425 |
| Found | $4.0 \times 10^2$ | $4.1 \times 10^2$ |

DENAKOL EX-832 used as the starting material is an industrial material, and has distribution of the moles of the added ethylene oxide among the molecules. From the above result, two double bonds and two cationic groups were found to be introduced in average.

The disappearance of the epoxide group and the formation of the cationic group in the DENAKOL EX-832, the starting material, were confirmed by proton NMR and $^{13}$C NMR as below.

1. By proton NMR, the starting material was found to have the spectrum of the methylene group —CH—CH$_2$ of the terminal glycidyl group at chemical shift of δ=2.5–3.0, whereas the reaction product was found not to have the spectrum at this chemical shift.

2. The tertiary amine monomer (N,N-dimethyl-2-hyroxypropylacrylamide), another starting material, had spectrum belonging to N—CH$_3$ at the chemical shift of δ=2.3–2.8, whereas in the product there was found that the chemical shift to δ=3.2–3.3 occurred belonging to the spectrum of the tertiary ammonium group N$^+$CH$_3$.

3. By $^{13}$C NMR, the product was found to have a peak assigned to N$^+$CH$_3$ at δ=52–53.

As described above, the results of measurement of the bromine number (namely, double bond equivalant), colloidal titration (namely, cation equivalent), and NMR showed that the reaction had proceeded in the synthesis reaction in this Example as desired to form the intended compound.

SYNTHESIS EXAMPLE 2

The exemplified compound (2-5) of the formula

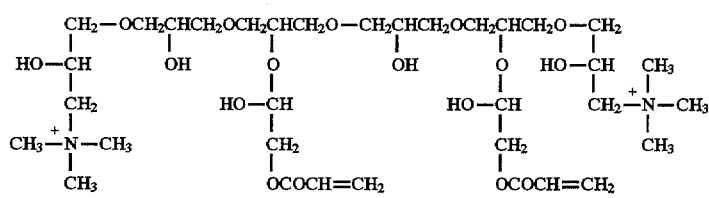

which belongs to the compounds of General Formula (5) was synthesized according to the aforementioned Synthesis Route 2.

To 350 g (about 2 epoxy equivalents) of polyglycerin polyglycidyl ether (epoxy equivalent: 173, DENAKOL EX-512, trade name, produced by Nagase Kasei Kogyo K.K.; n is about 2) of the typical structure

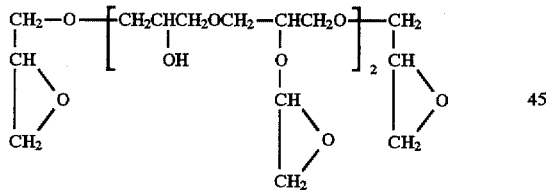

there were added 20 g of ethyl alcohol and 100 g of water as catalyzers. Therein, 195 g (1 mol) of trimethylamine hydrochloride was dissolved to form a reaction mixture. It was mixed uniformly in a pressure reactor in the same manner as in Synthesis Example 1. Then the mixture was heated at about 60° C. for 15 hours in the tightly closed reactor with stirring. After completion of the reaction, water and unreacted trimethylamine hydrochloride were removed under a reduced pressure to obtain the product as a viscous liquid. The resulting intermediate had an epoxy equivalent of 530. 250 Grams of this intermediate in terms of the pure substance was mixed with 40 g of acrylic acid, and the mixture was reacted at 80° C. with removal of formed water under refluxing for 6 hours to complete the esterification of the intermediate. After the completion of the reaction, the resulting product was dissolved in water. Water and unreacted acrylic acid were removed at 50° C. under a reduced pressure to obtain the intended product.

The final product contained water at a content of 12%. The product was subjected to measurement of the bromine value and the cation equivalent. The results are shown below.

TABLE 2

|  | Double bond equivalent | Cation equivalent |
| --- | --- | --- |
| Calculated | 514 | 566 |
| Found | 5.8 × 10$^2$ | 5.2 × 10$^2$ |

The compound of this Synthesis Example 2 was subjected to proton NMR and $^{13}$C NMR measurement, and the formation of the quaternary ammonium group was confirmed in the same manner as in Synthesis Example 1.

SYNTHESIS EXAMPLE 3

The exemplified compound (3-4) of the formula

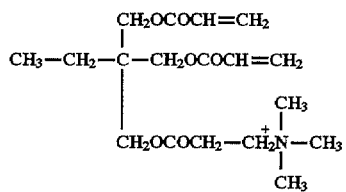

which belongs to the compounds of General Formula (4) was synthesized according to the aforementioned Synthesis Route 3.

Trimethylolpropane triacrylate (trade name: Arronix, produced by Toagosei Chemical Co., Ltd.) was used as the starting material, which is a photopolymerizable oligomer having three acryloyl group, and having the chemical structure of the formula

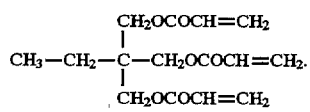

300Grams (about 1 mol) of this trimethylolpropane triacrylate was reacted with 32 g (about ⅓ mol) of trimethylamine hydrochloride under a nitrogen atmosphere at 50° C. with vigorous agitation to obtain the product.

This final product (3-4) was subjected to measurement of the bromine number, and the cation equivalent. The results are as shown below.

TABLE 3

|  | Double bond equivalent | Cation equivalent |
|---|---|---|
| Calculated | 198 | 396 |
| Found | $2.0 \times 10^2$ | $4.0 \times 10^2$ |

SYNTHESIS EXAMPLE 4

The exemplified compound (4-1) of the formula

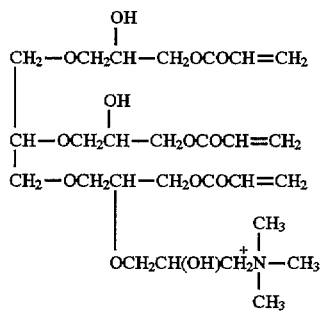

which belongs to the compounds of General Formula (4) was synthesized according to the aforementioned Synthesis Route 4.

Glycerin triglycidyl ether (trade name: DA-314, produced by Nagase Kasei Kogyo K.K.; molecular weight: 476) was used as the starting material, which is an acrylate ester of an epoxy resin, of the typical chemical structure of the formula

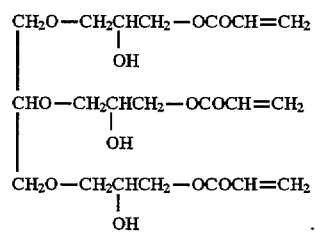

To 480 g of this glycerin triglycidyl ether (DA-314), was added 60 g (about 0.4 mol) of 2,3-epoxypropyltrimethylammonium chloride (trade name: Wisetex E-100, a cationizing agent). The mixture was stirred at 70° C. for 8 hours to introduce a cation to a part of the hydroxyl groups of DA-314. Since this DA-314 has plural hydroxyl groups as the reactive site in the molecule (two or three hydroxyl, 2.4 in average), the product is naturally a mixture.

This final product (4-1) was subjected to measurement of the bromine number, and the cation equivalent in the same manner as in Synthesis Example 1. The results are as shown below.

TABLE 4

|  | Double bond equivalent | Cation equivalent |
|---|---|---|
| Calculated | 270 | 1350 |
| Found | $2.65 \times 10^2$ | $1.4 \times 10^3$ |

SYNTHESIS EXAMPLE 5

The exemplified compound (2-7) of the formula

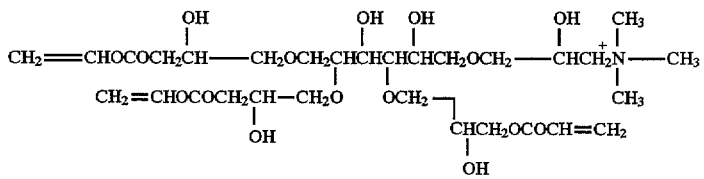

which belongs to the compounds of General Formula (6) was synthesized according to the aforementioned Synthesis Route 2, as follows.

Sorbitol polyglycidyl ether (epoxy equivalent: 170, trade name: DENAKOL EX-611, produced by Nagase Kasei Kogyo K.K.) was used as the starting material. According to Reaction Route 2, 340 g of this EX-611 was reacted successively with 0.5 mol of trimethylamine hydrochloride and 1.5 mol of acrylic acid to obtain the product.

This product (2-7) was subjected to measurement of the bromine number, and the cation equivalent in the same manner as in Synthesis Example 1. The results are as shown below.

TABLE 5

|  | Double bond equivalent | Cation equivalent |
|---|---|---|
| Calculated | 289 | 579 |
| Found | $3.0 \times 10^2$ | $5.6 \times 10^2$ |

SYNTHESIS EXAMPLE 6

The exemplified compound (1-7) of the formula

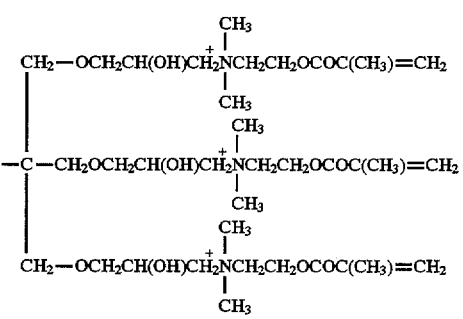

which belongs to the compounds of General Formula (2) was synthesized according to the aforementioned Synthesis Route 1 as follows.

Trimethylolpropane polyglycidyl ether (epoxy equivalent: 145, trade name: DENAKOL EX-321, produced by Nagase Kasei Kogyo K.K.) was used as the starting material. 290 Grams of this EX-321 was reacted with 314 g of N,N-dimethylaminoethyl methacrylate to introduce acrylic cation moieties in the same manner as in Synthesis Example 1 to obtain the product.

This product (1-7) was subjected to measurement of the bromine number, and the cation equivalent in the same manner as in Synthesis Example 1. The results are as shown below.

TABLE 6

|  | Double bond equivalent | Cation equivalent |
|---|---|---|
| Calculated | 229 | 229 |
| Found | 2.3 × 10² | 2.2 × 10² |

SYNTHESIS EXAMPLE 7

The exemplified compound ( 1-8 ) of the formula

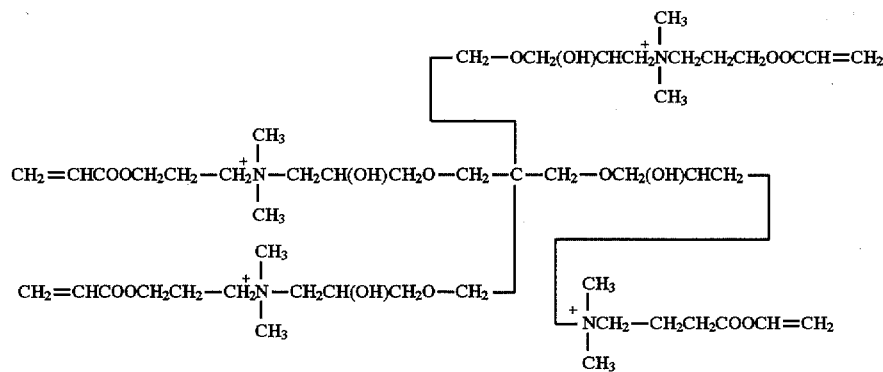

which belongs to the compounds of General Formula (3) was synthesized according to the aforementioned Synthesis Route 1.

Pentaerythritol polyglycidyl ether (epoxy equivalent: 231, trade name: DENAKOL EX-411, produced by Nagase Kasei Kogyo K.K.) as the starting material was allowed to react with of N,N-dimethylaminopropyl acrylate according to Synthesis Route 1 to obtain the product.

This product (1-8) was subjected to measurement of the bromine number, and the cation equivalent in the same manner as in Synthesis Example 1. The results are as shown below.

TABLE 7

|  | Double bond equivalent | Cation equivalent |
|---|---|---|
| Calculated | 388 | 388 |
| Found | 3.9 × 10² | 3.7 × 10² |

EXAMPLE 1

A composition consisting of the components:

| Compound (1-6) (Synthesis Example 1) | 97 parts |
|---|---|
| 2-Hydroxy-2-methyl-1-phenyl-1-one (Irgacure 1173, produced by Japan Ciba Geigy Co.) | 3 parts |
| Isopropyl alcohol | 15 parts | was prepared. This composition was applied on a polyethylene terephthalate film of 85 μm thick by a bar coater, and the applied composition was dried at 70° C. for three minutes to form a layer of about 10 μm in dry thickness. This film was exposed to ultraviolet rays from a high-pressure mercury lamp at an integrated dose of 150 mJ/cm² (light quantity at about 365 nm) to cause polymerization to form an ink-receiving layer.

Pieces of this film were dipped respectively into the six kinds of water-based ink-jet recording dye solutions (dye concentration: 8% to 10% by weight), respectively, to prepare six sample pieces for 60 seconds. The film pieces after the dipping into the dye solutions were washed with water and dried to obtain six film pieces in transparent dark-colored state. The colored film pieces was well dyed without bleeding of dyes by further washing with water. Dyes used for dyeing:

C.I. Food Black 2,

C.I. Direct Blue 199,

C.I. Direct Yellow 86,

Black Dye of the formula

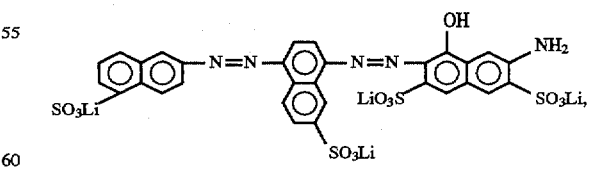

Black Dye of the formula

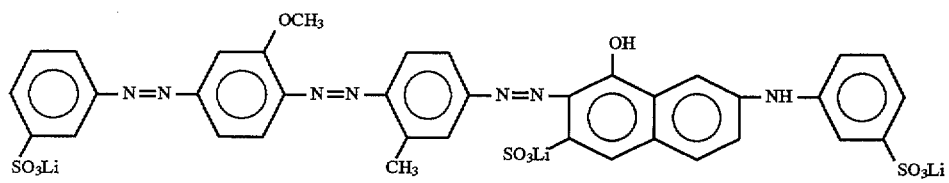

and

Magenta Dye of the formula

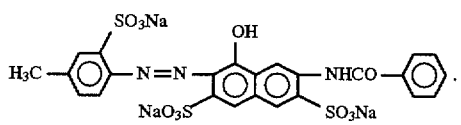

EXAMPLE 2

A composition consisting of the components:

| Compound (2-5) (Synthesis Example 2) | 70.0 parts |
| --- | --- |
| Polyethylene glycol 400 diacrylate | 30.0 parts |
| Irgacure 184 | 4.0 parts |
| Isopropyl alcohol | 40 parts | was prepared. This composition was applied on a polyethylene terephthalate film of 85 μm thick by a bar coater to form a layer of about 15 μm in dry thickness. This film was exposed to ultraviolet rays from a high-pressure mercury lamp at an integrated dose of 200 mJ/cm² to cause polymerization to form an ink-receiving layer.

Pieces of this film were tested for dyeing with ink-jet inks prepared by using the dyes in Example 1 in the same manner as in Example 1 except that the ink solvent was a mixture of water, thiodiglycol, urea, and isopropyl alcohol in a ratio of 80:10:5:5 by weight, and the dye concentration was 3% by weight. As the results, the film pieces showed excellent dye fixing properties and adhesiveness.

EXAMPLE 3

A composition consisting of the components:

| Compound (3-4) (Synthesis Example 3) | 60.0 parts |
| --- | --- |
| Kayarad DPCA 30 (Produced by Nippon Kayaku Co.) | 30.0 parts |
| Cation-modified PVA (cationization degree: 10%, molecular weight: 1.5 × 10⁴, aqueous 20% solution) | 50.0 parts |
| Irgacure 651 | 3.5 parts | was prepared. This composition was applied on a polyethylene terephthalate film of 100 μm thick by a bar coater and was dried at 80° C. for 10 minutes in an air oven to form a layer of about 15 μm in dry thickness. This film was cured by irradiation with ultraviolet rays at an integrated dose of 200 mJ/cm².

On this film color ink-jet printing was conducted with a color ink-jet printer, BJC-600J (trade name, produced by Canon K.K.) to print isolated solid patterns of 2 cm×2 cm, respectively, of seven colors of black, yellow, cyan, magenta, red, blue, and green. As the results, distinct color chart was formed with every pattern having sharp periphery without ink bleeding.

EXAMPLE 4

A white dispersion was prepared by dispersing the components below by means of an ultrahomogenizer at 8,000 rpm for 15 minutes:

| Compound (4-1) (Synthesis Example 4) | 70.0 parts |
| --- | --- |
| Epoxy acrylate DA314 (produced by Nagase Kasei Kogyo K.K.) | 30.0 parts |
| CGI 1700 (photopolymerization initiator, produced by Japan Ciba Geigy Co.) | 4.0 parts |
| Titanium oxide (CR-50, produced by Ishihara Sangyo K.K.) | 7.0 parts |
| Dispersant (monoethanolamine salt of Phosphanol RE610, produced by Toho Chemical Industry Co.) | 1.0 part |
| Water | 70.0 parts |
| Isopropyl alcohol | 30.0 parts. |

This dispersion was applied onto a polycarbonate plate by means of a bar coater in a thickness of 15 μm. The applied dispersion layer was cured by irradiation of ultraviolet rays at an integrated dose of 300 mJ/cm². On this substrate, color printing was conducted with the same color ink-jet printer as in Example 3. As the results, the obtained printed matter was excellent in ink absorbency, colorfulness, and water fastness. In particular, the color reflection density was excellent since the ink-receiving layer was white.

EXAMPLE 5

The components below were treated for dispersion in the same manner as in Example 4 to prepare a white photosensitive dispersion:

| Compound (2-7) (Synthesis Example 5) | 70.0 parts |
| --- | --- |
| Epoxy acrylate DA314 | 30.0 parts |
| CGI 1700 | 4.0 parts |
| Titanium oxide (CR-50) | 7.0 parts |
| Dispersant (monoethanolamine salt of Phosphanol RE610) | 1.0 parts. |

To 100 parts of this dispersion, 50 parts of an aqueous 20% solution of cationized PVA (cationization degree: 10%, molecular weight: 1.5×10⁴) to prepare a water-based paint.

This paint was applied onto an unsaturated polyester plate by a roll coater in a thickness of 10 μm. The cured plate had a dry surface, and was in an easily storable state. The applied layer was cured with a conveyer type UV curing apparatus having a high pressure mercury lamp of 80 W/cm at a line curing rate of 2 m/min. On this white plate, a artificial marble pattern was printed with a color ink-jet printer. The print was stable in an ink-receiving property.

EXAMPLE 6

The components:

| Titanium oxide (CR-50) | 25 parts |
| --- | --- |
| Aqueous 20% solution of styrene-acrylic acid-acrylonitrile copolymer (monomer ratio: 50:30:20 by weight, molecular weight: 6,500 | 30 parts |
| Water | 150 parts |
| Isopropyl alcohol | 10 parts | were mixed well. The mixture was treated for dispersion with a 200-ml sand mill with glass beads to prepare an aqueous titanium oxide dispersion of a solid matter content of 20%.

29

To 100 parts of this dispersion, the components below were added to prepare an aqueous photosensitive white paint composition:

| | |
|---|---|
| Compound (1-7) (Synthesis Example 6) | 80 parts |
| Cationized starch (aqueous 25% solution, cationization degree: 10%) | 80 parts. |

This paint composition was applied onto a non-coated paper sheet (plain paper sheet) of 100 μm thick with a wire bar so as to have a dry coating thickness of 25 μm, and was dried at 70° C. for 10 minutes in an oven. The coating layer was cured by polymerization with the same UV irradiation apparatus as in Example 5.

On the resulting coated paper, a printing test pattern including letters, picture images, and graphs was printed. As the results, the color inks were fixed satisfactorily to form a sharp colorful print. After the printing, water was sprinkled over the printed matter for testing the water fastness of the printed image. The water fastness was found to be satisfactory without bleed of the dye.

EXAMPLE 7

A composition consisting of the components:

| | |
|---|---|
| Compound (1-8) (Synthesis Example 7) | 96 parts |
| Irgacure 184 | 4 parts |
| Ethyleneglycol monoethylether | 30 parts | was prepared. This composition was applied on a glass base plate by a spinner in a dry thickness of 3 μm. The applied composition was photopolymerized by irradiation of ultraviolet rays for 30 seconds by use of a 500 W extra-high pressure mercury lamp. Onto this plate, a mosaic pattern was printed using ink-jet inks employing dyes of red (R), green (G), and blue (B). After the printing, the printed matter was dried at 120° C. for 5 minutes to evaporate off the solvent for complete dryness. The resulting filter glass was excellent in transmitted color density and sharpness of the image, and had excellent water fastness to a subsequent washing treatment.

EXAMPLE 8

A recording medium was prepared in the same manner as described in Example 3, except a composition consisting of the components

| | |
|---|---|
| Compound (4-1) | 25 parts |
| Blemmer AB-350 (polyethyleneglycol monoacrylate (n = 6 to 8); produced by Nippon Yushi Co.) | 25 parts |
| Dimethylaminoethyl acrylate | 40 parts |
| Hydroxyethyl cellulose | 10 parts |
| CGI-1700 (photopolymerization initiator, Produced by Japan Ciba Geigy Co.) and | 3.5 parts |
| A mixture of water and isopropyl alcohol (50:50 by weight) | 50 parts | was used in place of the composition of Example 3. Color printing was conducted in the same manner as described in Example 3. As the results, the same effect as in Example 3 was obtained.

EXAMPLE 9

A recording medium was prepared in the same manner as described in Example 3, except a composition consisting of the components

| | |
|---|---|
| Compound (3-2) | 40 parts |
| N-Methylolacrylamide | 20 parts |
| PEG 200 diacrylate | 20 parts |
| Polyvinylpyrrolidone (PVP K-90; produced by ISP Technologies) | 20 parts |
| Irgacure 184 (photopolymerization initiator, produced by Japan Ciba Geigy Co.) and | 4 parts |
| A mixture of water and isopropyl alcohol (50:50 by weight) | 50 parts | was used in place of the composition of Example 3. Color printing was conducted in the same manner as described in Example 3. As the results, the same effect as in Example 3 was obtained.

As described above, the present invention can provide a curable composition suitable for producing ink-jet paper sheets and OHP films, in particular, a resin composition and a recording medium using thereof which fit a performance of ink-jet color printers widely used recently, and which satisfy, in addition to a good coloring ability, requirements that (1) an ink-receiving layer can be formed by a short time treatment, (2) the formed layer has a high adhesiveness to the base material, (3) ink can be fixed in a short time by curing with exposure of active energy ray, (4) the layer has a high affinity with coloring matter (dye or pigment) in the ink, (5) sharp images with high resolution can be formed, (6) the resin layer has a high durability, and so forth, particularly exhibit a high absorbency for water-based ink and a high affinity to a coloring matter.

What is claimed is:

1. A recording medium comprising a base material and an ink-receiving layer formed thereon, the ink-receiving layer comprising a polymer of a cationic polyacryloyl compound having two or more acryloyl groups and one or more cationic groups in a molecule, represented by any of General Formulae (1) to (6)

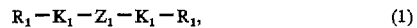

(1)

(2)

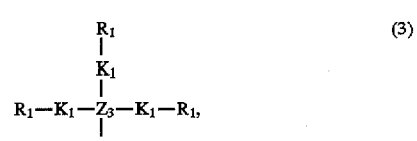

(3)

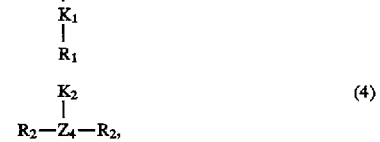

(4)

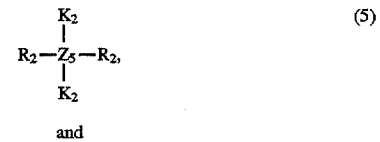

(5)

and

-continued $$R_2-Z_6-R_2 \quad \text{with } R_2 \text{ and } K_2 \text{ substituents} \tag{6}$$

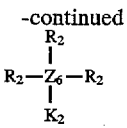

wherein $Z_1$ to $Z_6$ represent independently a residue derived from a polyhydric alcohol or a polyepoxide, $K_1$ represents independently a radical of the formula

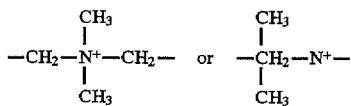

$K_2$ represents a radical of the formula

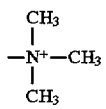

$R_1$ represents independently a radical of the formula

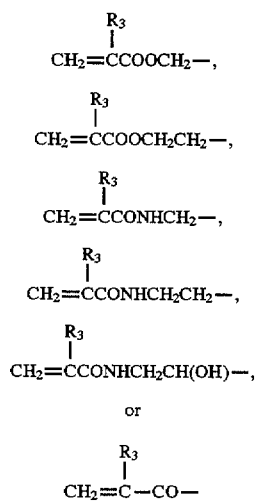

or $$CH_2=\overset{R_3}{\underset{|}{C}}-CO-$$

wherein $R_3$ is independently H— or $CH_3$—, and $R_2$ represents independently a radical of the formula $CH_2=CHCOO-$, or $CH_2=C(CH_3)COO-$.

2. The recording medium according to claim 1, wherein the ink-receiving layer comprises the polyacryloyl compound at a content of not less than 25% by weight of the ink-receiving layer.

3. The recording medium according to claim 1, wherein the ink-receiving layer comprises the polyacryloyl compound at a content of not less than 50% by weight of the ink-receiving layer.

4. The recording medium according to claim 1, wherein the ink-receiving layer comprises the polyacryloyl compound at a content of from 55% to 98% by weight of the ink-receiving layer.

5. The recording medium according to claim 1, wherein the ink-receiving layer further comprises a polymerization initiator which is activatable by active energy rays.

6. The recording medium according to claim 1, wherein the ink-receiving layer comprises the polymerization initiator in an amount of from 1 to 10 parts by weight based on 100 parts by weight of the polyacryloyl compound.

7. The recording medium according to claim 1, wherein the ink-receiving layer further comprises a photopolymerizable compound having two or more acryloyl groups but no cationic group.

8. The recording medium according to claim 7, wherein the photopolymerizable compound is selected from the group consisting of (meth)acrylic esters of polyhydric alcohols, glycols, polyethylene glycols, polyesterpolyols, polyetherpolyols, and urethane-modified polyethers or polyesters; and (meth)acrylate esters of epoxy resins.

9. The recording medium according to claim 7, wherein the ink-receiving layer comprises the photopolymerizable compound at a content of from 10 to 200 parts by weight based on 100 parts by weight of the polyacryloyl compound.

10. The recording medium according to claim 7, wherein the ink-receiving layer further comprises a water-soluble polymer.

11. The recording medium according to claim 10, wherein the water-soluble polymer is selected from the group consisting of polyvinyl alcohol, cationic polyvinyl alcohol, cationic starch, water-soluble cationic resins having a cationic monomer unit at a ratio of 15 mol % or more, polyacrylamides, poly-N-vinylpyrrolidone, polyethylene oxide, and polyethylene oxide/propylene oxide block copolymers.

12. The recording medium according to claim 1, wherein the base material is not ink-absorbent.

13. The recording medium according to claim 12, wherein the base material is a plastic material.

14. The recording medium according to claim 1, wherein the base material is a paper sheet.

15. The recording medium according to claim 1, wherein the polyacryloyl compound is a material selected from the group consisting of the formulae (a) to (g):

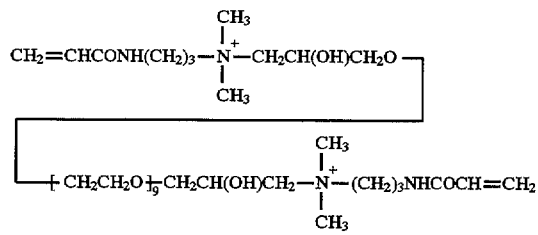

(a)

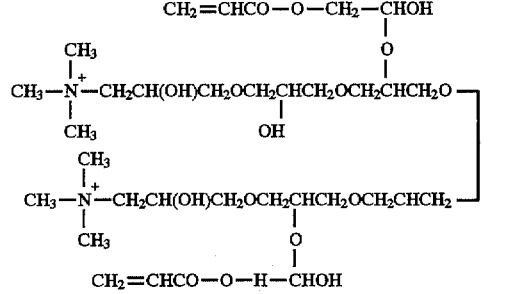
(b)
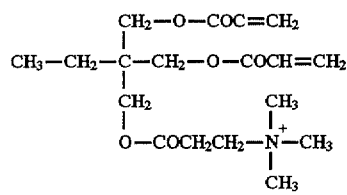
(c)
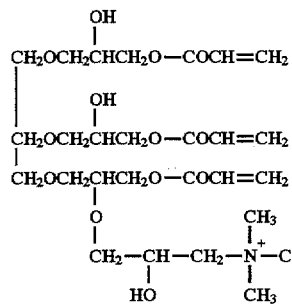
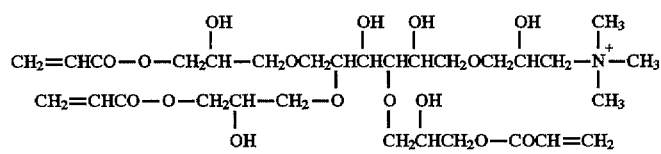
(e)
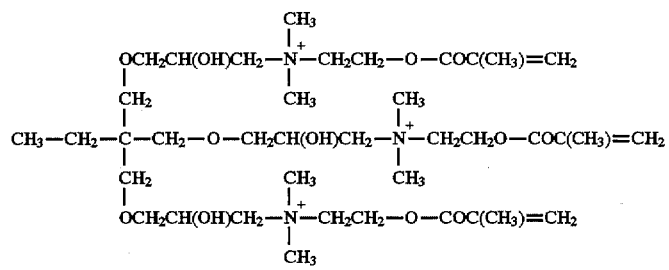
(f)
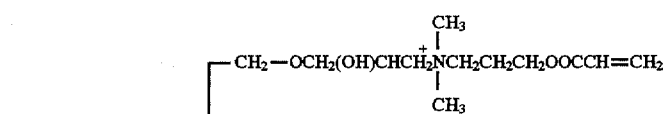
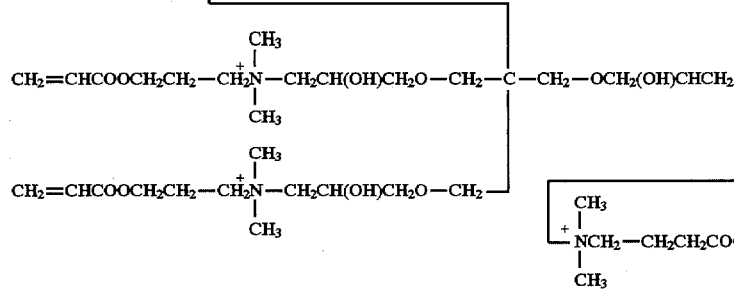
(g)

16. An image-forming method comprising applying a water-based ink onto the recording medium according to any one of claims 1 to 14 and 15.

17. The image-forming method according to claim 16, including applying the ink by ejecting the ink from an ink-jet printer.

18. The image-forming method according to claim 17, wherein the ink is applied from a bubble-jet printer.

* * * * *

UNITED STATES PATENT AND TRADEMARK OFFICE
CERTIFICATE OF CORRECTION

PATENT NO. : 5,681,643

DATED : October 28, 1997

INVENTOR(S): HIROMICHI NOGUCHI ET AL.

It is certified that error appears in the above-identified patent and that said Letters Patent is hereby corrected as shown below:

COLUMN 5

Line 13, "$(n \geq b3)$" should read --$(n \geq 3)$--;
Line 15, "group" should read --group,--.

COLUMN 10

Line 3, "includes" should read --include--.

COLUMN 15

Line 62, "a" should read --an--;
Line 64, "originated from" should read --by--.

COLUMN 18

Line 41, "oarboxymethylcellulose," should read --carboxymethylcellulose,--.

COLUMN 21

Line 7, "hyroxypropylacrylamide)," should read --hydroxypropylacrylamide),--.

COLUMN 22

Line 61, "300Grams" should read --300 Grams--.

UNITED STATES PATENT AND TRADEMARK OFFICE
CERTIFICATE OF CORRECTION

PATENT NO. : 5,681,643

DATED : October 28, 1997

INVENTOR(S): HIROMICHI NOGUCHI ET AL.

It is certified that error appears in the above-identified patent and that said Letters Patent is hereby corrected as shown below:

<u>COLUMN 26</u>

Line 42, "was" should read --were--.

<u>COLUMN 28</u>

Line 40, "1.0 parts." should read --1.0 part.--;
Line 50, "a" should read --an--.

<u>COLUMN 33</u>

Formula (d), insert: --(d)--.

Signed and Sealed this

Fifth Day of May, 1998

*Attest:*

BRUCE LEHMAN

*Attesting Officer*     *Commissioner of Patents and Trademarks*